(12) United States Patent
Hung et al.

(10) Patent No.: US 6,834,011 B2
(45) Date of Patent: Dec. 21, 2004

(54) STRUCTURE, FABRICATION METHOD AND OPERATING METHOD FOR FLASH MEMORY

(75) Inventors: Chih-Wei Hung, Hsin-Chu (TW); Da Sung, Hsin-Chu (TW)

(73) Assignee: Powerchip Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 10/829,414

(22) Filed: Apr. 20, 2004

(65) Prior Publication Data

US 2004/0196714 A1 Oct. 7, 2004

Related U.S. Application Data

(62) Division of application No. 10/269,460, filed on Oct. 11, 2002, now Pat. No. 6,778,438.

(30) Foreign Application Priority Data

Apr. 9, 2002 (TW) ........................................ 91107052

(51) Int. Cl.[7] ............................................. G11C 16/00
(52) U.S. Cl. ........................... 365/185.05; 365/185.18; 365/185.28; 365/184.29
(58) Field of Search ..................... 365/185.05, 185.18, 365/185.27, 185.28, 185.29

(56) References Cited

U.S. PATENT DOCUMENTS

| | | | | |
|---|---|---|---|---|
| 5,077,691 A | | 12/1991 | Haddad et al. | |
| 6,137,727 A | * | 10/2000 | Cleveland | 365/185.27 |
| 6,144,583 A | * | 11/2000 | Shiba | 365/185.13 |
| 6,169,693 B1 | | 1/2001 | Chan et al. | 365/185.3 |
| 6,240,021 B1 | | 5/2001 | Mori | 365/185.27 |
| 6,501,685 B2 | | 12/2002 | Hsu et al. | 365/185.33 |
| 6,628,550 B1 | * | 9/2003 | Hung et al. | 365/185.29 |
| 6,721,206 B2 | * | 4/2004 | Abedifard | 365/185.26 |

* cited by examiner

Primary Examiner—Tan T. Nguyen
(74) Attorney, Agent, or Firm—Ladas & Parry

(57) ABSTRACT

A flash memory structure. The structure includes device isolation regions defined on an active area of a substrate, a deep well of first conductive type, stacked gate structures, a tunneling oxide layer, wells of second conductive type, sources and drains, wherein the aforementioned deep well of first conductive type is located in the active area and below the device isolation regions. The aforementioned wells of second conductive type are formed in the area corresponding to the drains and below the device isolation regions between the adjacent stacked gate structures. The aforementioned sources and drains are in the active areas located on both sides of the control gates, wherein the drains are enclosed by the wells of second conductive type; and the sources are located on both sides of the wells of second conductive type and electrically connected with each other via the deep well of first conductive type. Moreover, the present invention also provides a fabrication method and an operating method for the aforementioned structure.

4 Claims, 14 Drawing Sheets

Vcs = GND

STRUCTURE, FABRICATION METHOD AND OPERATING METHOD FOR FLASH MEMORY

CROSS-REFERENCE TO RELATED APPLICATIONS

This patent application is a divisional application of U.S. Ser. No. 10/269,460, filed on Oct. 11, 2002 now U.S. Pat. No. 6,778,438, which claims priority to Taiwanese Application No. 91107052, filed on Apr. 9, 2002.

BACKGROUND OF THE INVENTION

1. Field of the Invention

The present invention relates to a structure, fabrication method, and operating method for a NOR-type flash memory, and particularly to the structure, fabrication method and operating method for a NOR-type flash memory using a channel erase scheme to perform an erase function.

2. Description of the Related Art

INTEL corporation provides an ETOX-type flash memory, in which, to erase data, high voltage is applied to its source and the gate is simultaneously grounded. The following disadvantages occur. When performing the erase, the high voltage applied to the source generates band-to-band tunneling conduction, resulting in large current flowing from the source to the substrate. Further, the high voltage on the source also generates hot holes that are easily trapped in the tunneling oxide layer, resulting in so-called gate disturbance, thus lowering the capability of memory cell for holding charges. Moreover, the hot holes injected into the tunneling oxide layer also degrade the tunneling oxide layer, and lower its endurance. As well, in order to provide a high voltage on the source, a double diffused graded junction structure has to be designed, but the structure occupies quite a large area of the substrate, thus increasing the difficulty of maintaining reduced size in memory devices.

AMD Inc. provides another flash memory in U.S. Pat. No. 5,077,691, in which a high negative voltage is applied to the gate and a relatively lower positive voltage to the source of the memory cell. Although this design may resolve the aforementioned problems, the erasing function is still performed via the source, i.e. the so-called source-terminal erase. Since the erase characteristics for the device utilizing the scheme of source-terminal erase are usually nonuniformity, this device generally has very low reliability. Additionally, circuit designers must also take the negative voltage circuit design into account, so that this device requires circuit design of high complexity, with more varieties of peripheral circuit elements.

SUMMARY OF THE INVENTION

In view of the above, it is an object of the present invention to provide a NOR-type flash memory structure using a channel erase scheme to erase data. The present structure has high reliability in preventing nonuniform erase situations, and the high voltages used are all positive, thereby decreasing the complexity of circuit design.

Further, it is another object of the present invention to provide a fabrication method for NOR-type flash memory.

In addition, it is another object of the present invention to provide an operating method for NOR-type flash memory.

The present invention provides a flash memory structure, briefly described as follows. A device isolation region is located in a substrate to define an active area. A deep well of first conductive type is located in the substrate, wherein the deep well of first conductive type is disposed in the active area and the area below the device isolation region. A stacked gate structure is located on the substrate, and is composed of a floating gate, a dielectric layer, and a control gate. A tunneling oxide layer is located between the stacked gate structure and the substrate. A well of second conductive type is located in the area corresponding to the drain between the adjacent stacked gate structures, and is disposed in the area below the device isolation region located between the adjacent stacked gate structures. A spacer is located on both sides of the stacked gate structure. A source and a drain are in the active area located on both sides of the control gate, wherein the drain is enclosed by the well of second conductive type, and the source is electrically connected via the deep well of first conductive type.

According to an embodiment of the present invention, in the aforementioned flash memory structure, the deep well of first conductive type is an n-well region, and the well of second conductive type is a p-well region, and the source and the drain are n-doped regions.

The present invention also provides a fabrication method for flash memory, briefly described as follows. A device isolation is formed in a substrate to define a striped active area. A deep well of first conductive type is formed in the substrate, and the deep well of first conductive type is disposed in the active area and the area below the device isolation region. Thereafter, a tunneling oxide and an electrically conductive layer are formed on the active area, and then on the top of these two layers, a dielectric layer and a second electrically conductive layer are formed. Thereafter, the second electrically conductive layer, the dielectric layer and the first electrically conductive layer are defined to convert the second and first electrically conductive layers into the control gate and floating gate of a stacked gate structure. Subsequently, a well of second conductive type is formed in the area corresponding to the drain between the adjacent stacked gate structures, and is disposed in the area below the device isolation region located between the adjacent stacked gate structures. Thereafter, a drain is formed on the active area located on one side of the stacked gate structure, wherein the drain is enclosed by the well of second conductive type. Then, a spacer is formed on both sides of the stacked gate structure, and a source is formed in the active area located on the other side of the control gate, wherein the source is located on both sides of the well of second conducive type, and electrically connected via the deep well of first conductive type.

The present invention further provides an operating method to erase, programming and reading data on a flash memory, wherein a wordline voltage, a bitline voltage and a p-well voltage are respectively applied to the control gate, drain and p-well, each of which corresponds to a selected flash memory cell, the source of the flash memory is a common source mutually connected via a deep n-well, the drain is commonly used by two adjacent flash memory cells, and the p-well is located in the area corresponding to the drain between two adjacent control gates. The operating method of the present invention to erase, programming and reading data is described as follows. A high voltage is applied to a p-well, maintaining the wordline in a ground state, and the bitline and the common source are in a floating state to perform an erase operation. After a high voltage is applied to the wordline, a voltage lower than that applied to the wordline is applied to the bitline, maintaining the common source voltage, and the p-well voltage at the ground state to perform a programming operation. With proper voltage applied to the wordline, a voltage lower than that applied to the wordline is applied to the bitline to carry out a read operation.

According to an embodiment of the present invention, the p-well voltage is about 20 V, when an erase operation is performed. When a programming operation is performed, the wordline voltage is between 10V and 20V, and the bitline voltage is between 5V and 6.5V. When a read operation is performed, the bitline voltage is 1.5V.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A to FIG. 6A are layout diagrams showing the flow procedure of the method for fabricating a flash memory structure, according to a preferred embodiment of the present invention;

FIG. 1B to FIG. 6B are cross sections from the B-B line located on each of FIG. 1A to FIG. 6A FIG. 1C to FIG. 6C are cross sections from the C—C line located on each of FIG. 1A to FIG. 6A

DETAILED DESCRIPTION OF THE INVENTION

In accordance with the related figures, the structure, the fabrication method and the operating method for the flash memory of the present invention will be explained in details as follows.

Structure of Flash Memory

Figure 6A:
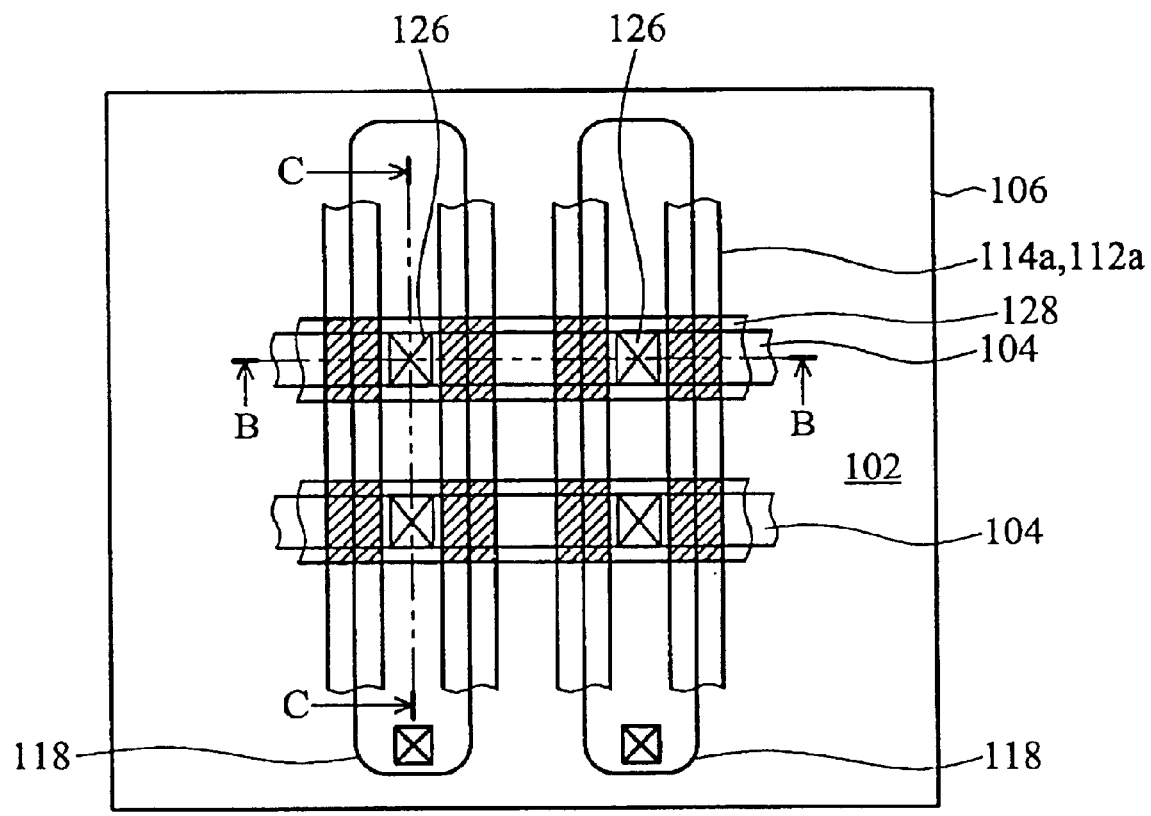
Figure 6B:
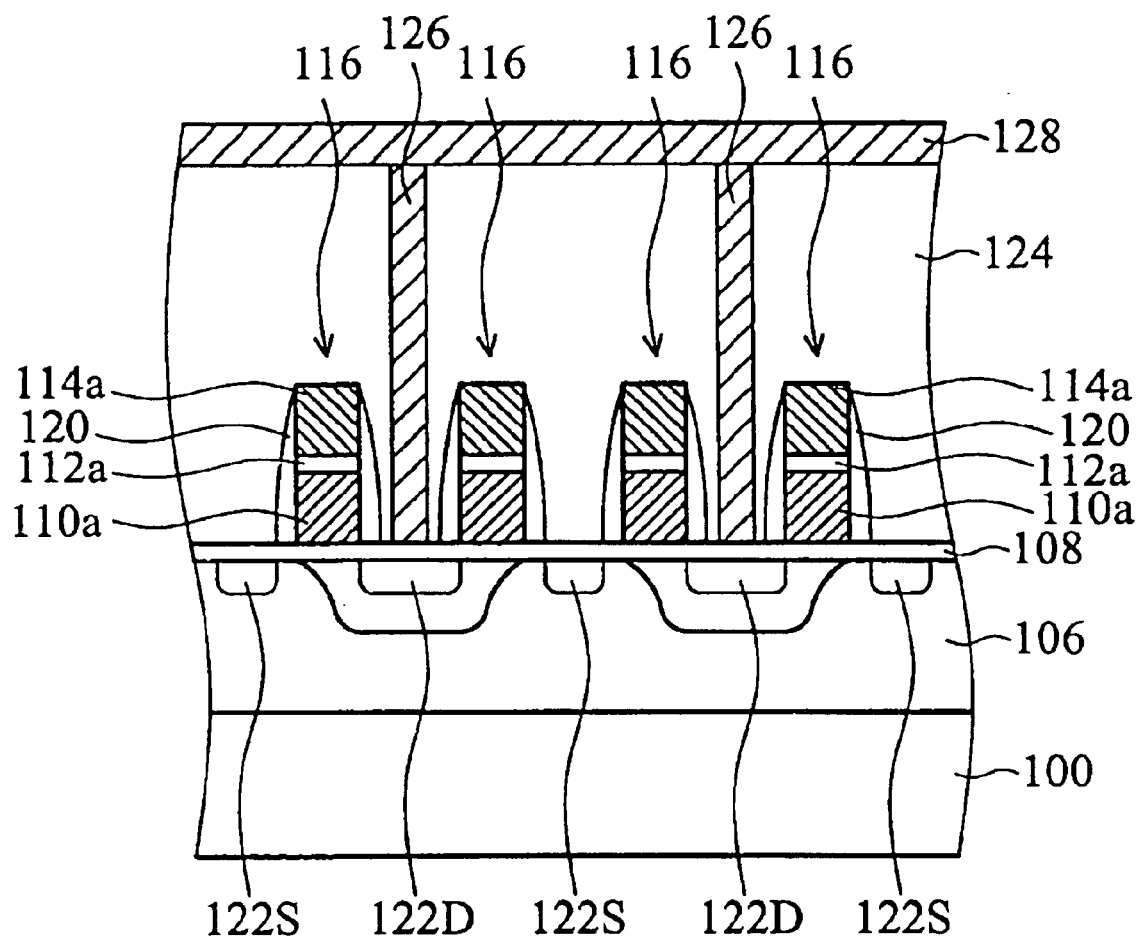
Figure 6C:
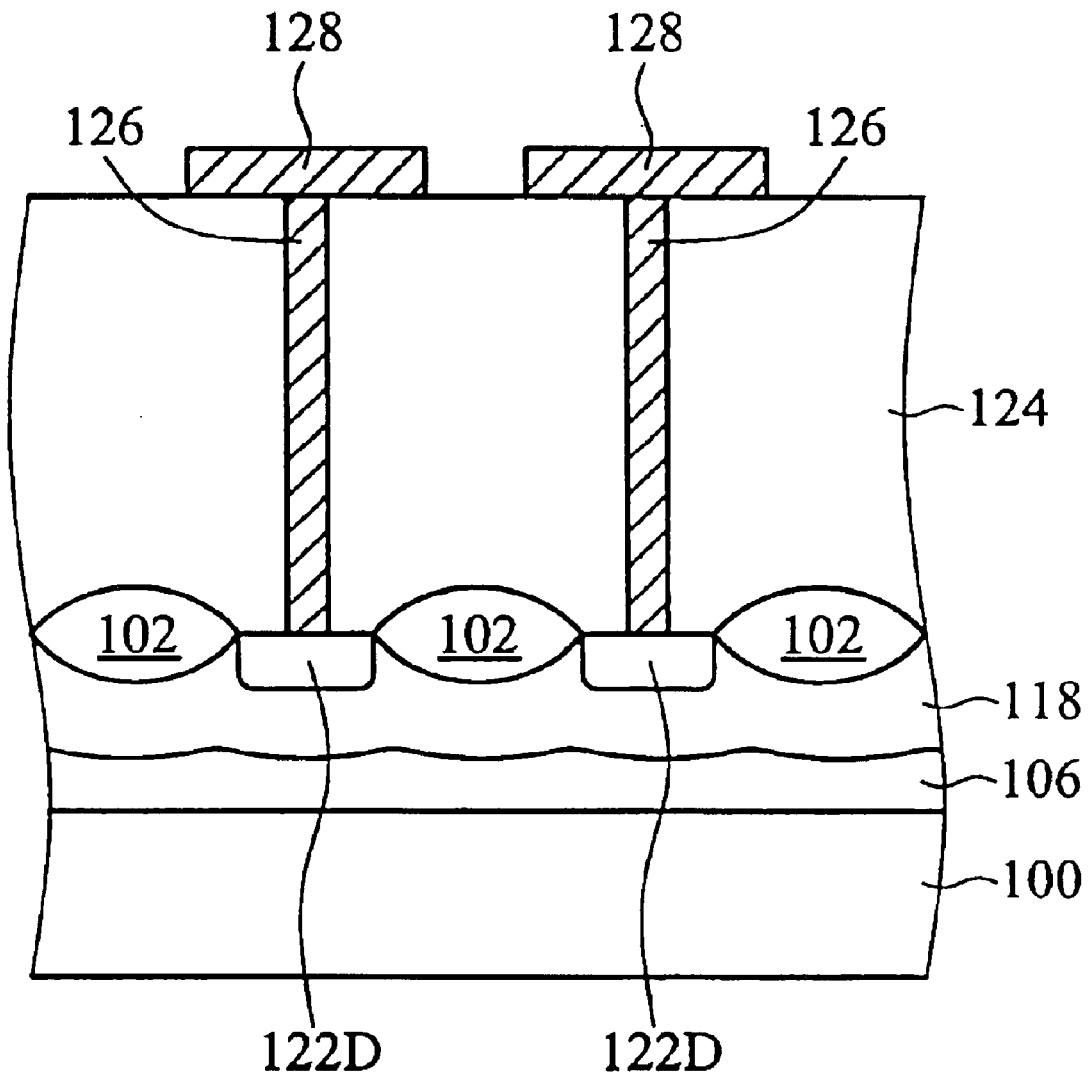

The present invention provides a flash memory structure, as shown in FIG. 6A to FIG. 6C, wherein FIG. 6A is a layout diagram, and FIG. 6B is a cross section taken from the B—B line located on FIG. 6A, and FIG. 6C is a cross section taken from the C—C line located on FIG. 6A.

The flash memory structure of the present invention comprises: a substrate (such as a p-type substrate) 100; device isolation regions 102; a deep well of first conductive type (such as a deep n-well) 106; stacked gate structures 116; a tunneling oxide layer 108; wells of second conductive type (such as a p-well) 118; spacers 120; sources 122S and drains 122D.

The aforementioned device isolation regions 102 are located in the substrate 100 to define striped active areas 104, wherein the device isolation regions 102 can be a field oxide layer or shallow trench isolations, and the field oxide layer is used in the figures as an example.

The aforementioned deep well of first conductive type 106 is located in the substrate 100, wherein the deep well of first conductive type 106 is disposed in the area below the device isolation regions 102 and the active areas 104, and also contacts the source 122S of each memory cell.

The aforementioned stacked gate structures 116 are located on the substrate 100, and each is composed of a floating gate 110a, a dielectric layer 112a and a control gate 114a, wherein the dielectric layer 112a between the control gate 114a and the floating gate 110a can be a stacked structure of silicon oxide/silicon nitride/silicon oxide.

Each of the aforementioned well of second conductive type 118 is formed in the area corresponding to the drain 122D between two adjacent stacked gate structures 116, and the well of second conductive type 118 is disposed in the area below the device isolation region 102 between the adjacent stacked gate structures (referring to FIG. 6C) and enclosed by the deep well of first conductive type 106. The well of second conductive type 118 is striped, and is approximately perpendicular to the active area 104.

The aforementioned spacers 120 are located on both sides of the stacked gate structures 116, and can be made of silicon oxide having good isolation property.

The aforementioned sources 122S and drains 122D are in the active area 104 located on both sides of the control gates 114a, wherein each drain 122D is enclosed by the well of second conductive type 118, and sources 122S are located on both sides of the wells of second conductive type 118 and electrically connected via the deep well of first conductive type 106.

The aforementioned deep well of first conductive type 106 can be a deep n-well. In such a case, the wells of second conductive type 118 are p-wells, and the sources 122S and drains 122D are n-doped regions.

The aforementioned flash memory structure further comprises: contact plugs 126 located on the drains 122D, wherein the contact plugs 126 are electrically connected to the drains 122D, and the drains 122D are connected to their corresponding bitlines 128 via the contact plugs 126.

Fabrication Method for Flask Memory

The flow procedure for fabricating the aforementioned flash memory structure of the present invention will be explained in details as follows, in accordance with FIG. 1A to FIG. 6A, FIG. 1B to FIG. 6B and FIG. 1C to FIG. 6C, wherein FIG. 1A to FIG. 6A are layout diagrams; FIG. 1B to FIG. 6B are cross sections from the B—B line located on each of FIG. 1A to FIG. 6A, and FIG. 1C to FIG. 6C are cross sections from the C—C line located on each of FIG. 1A to FIG. 6A Please refer to FIG. 1A to FIG. 1C. The substrate 100 is provided, such as a p-type semiconductor silicon substrate, wherein the device isolation regions 102 are formed in the substrate 100 to define the active areas 104. The device isolation regions 102 can be a field oxide layer formed by LOCOS (Local Oxidation), or shallow trench isolations (STIs).

Thereafter, the deep well of first conductive type 106 is formed on the memory cell region in the substrate 100, and is disposed in the area below the device isolation regions 102 and the active areas 104. The deep well of first conductive type 106 can be for example a deep N-well region. The deep n-well region is used as an example hereinafter.

The method for fabricating the aforementioned the deep well of first conductive type 106 comprises the following steps: forming a photoresist layer (not shown) on the substrate 100; defining a pattern of the deep well of first conductive type 106 on the photoresist layer; then performing an ion implantation by using the photoresist layer as a mask to implant n-type ions (such as P, phosphorous ion); and removing the aforementioned photoresist layer after the ions are implanted.

The ion implantation used to form the aforementioned deep well of first conductive type 106 is performed in two stages. The first stage is to implant P of about $5 \times 10^{13} \sim 1 \times 10^{14}/cm^2$ at about 800 keV to about 1.5 MeV, and the second stage is to implant P of about $1 \times 10^{13}/cm^2$ at about 360 keV.

Before the tunneling oxide layer 108 is to be formed on the active areas 104, the method of the present invention can further include a step of adjusting the threshold voltage of the flash memory cell region, and thus becomes: forming a photoresist layer (not shown) on the substrate 100; defining a pattern of the deep well of first conductive type 106 on the photoresist layer; then performing an ion implantation to implant p-type dopant (such as $BF_2$) to adjust the threshold voltage of the flash memory; and removing the photoresist layer, wherein the aforementioned ion implantation is to implant $BF_2$ of about $5 \times 10^{11} \sim 1 \times 10^2/cm^2$ at about 60 keV.

Figure 1A:
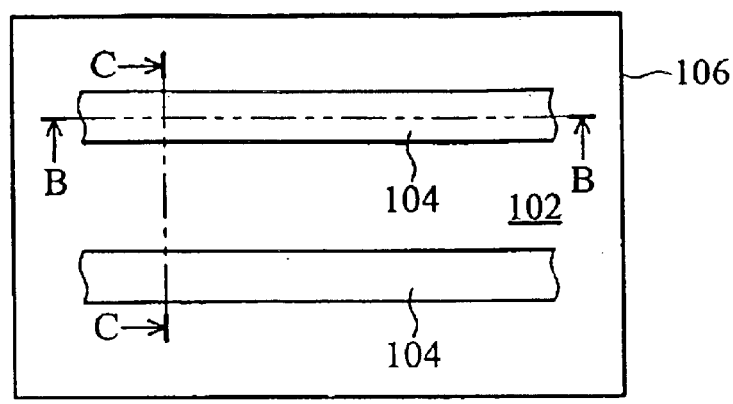
Figure 1B:
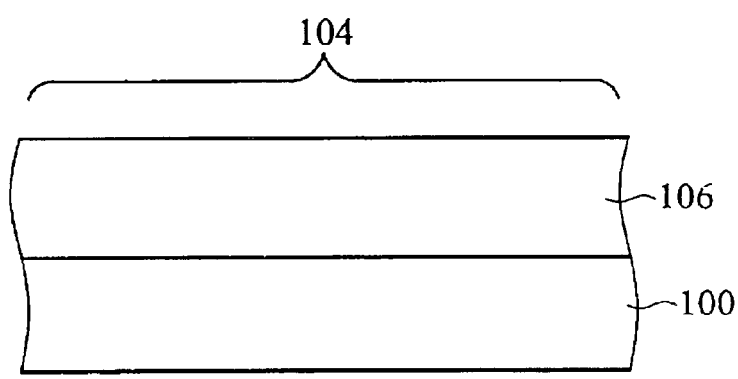
Figure 1C:
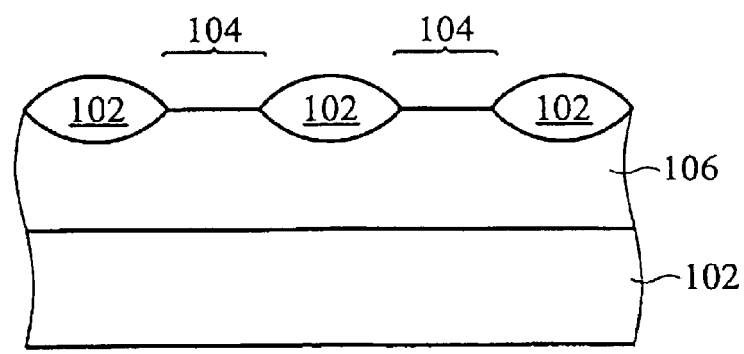
Figure 2A:
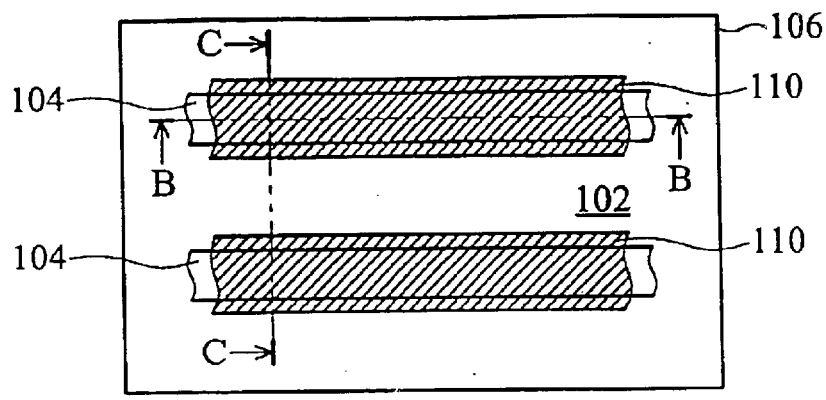
Figure 2B:
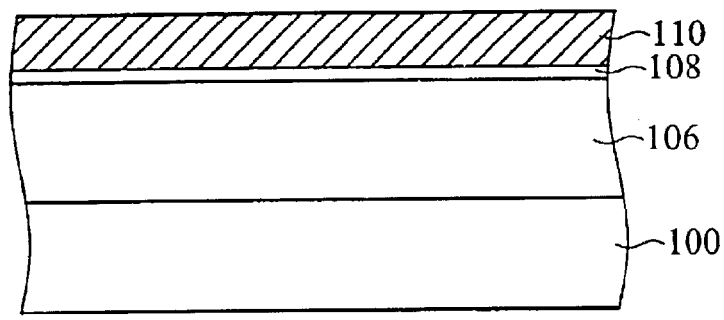
Figure 2C:
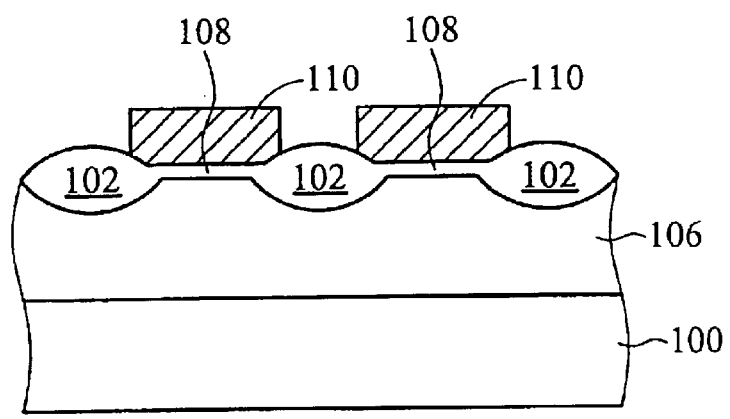

Thereafter, please refer to FIG. 2A to FIG. 2C. The tunneling oxide layer 108 and the first electrically conductive layer 110 are formed in sequence on the active areas 104, wherein the tunneling oxide layer 108 can be formed at a thickness of about 90–100 Å by thermal oxidation. The first electrically conductive layer 110 is striped, and can be a polysilicon layer doped with electrically conductive dopant. The method to form the first electrically conductive layer 110 on the active areas 104 is, for example: depositing a polysilicon layer of about 800 Å in thickness; performing an ion implantation; then performing a lithographic and etching process to form a striped polysilicon layer doped with conductive dopant (i.e. the first electrically conductive layer 110), wherein the striped polysilicon layer covers the active areas 104, and the first electrically conductive layer 110 forms a floating gate in the subsequent steps.

Figure 3A:
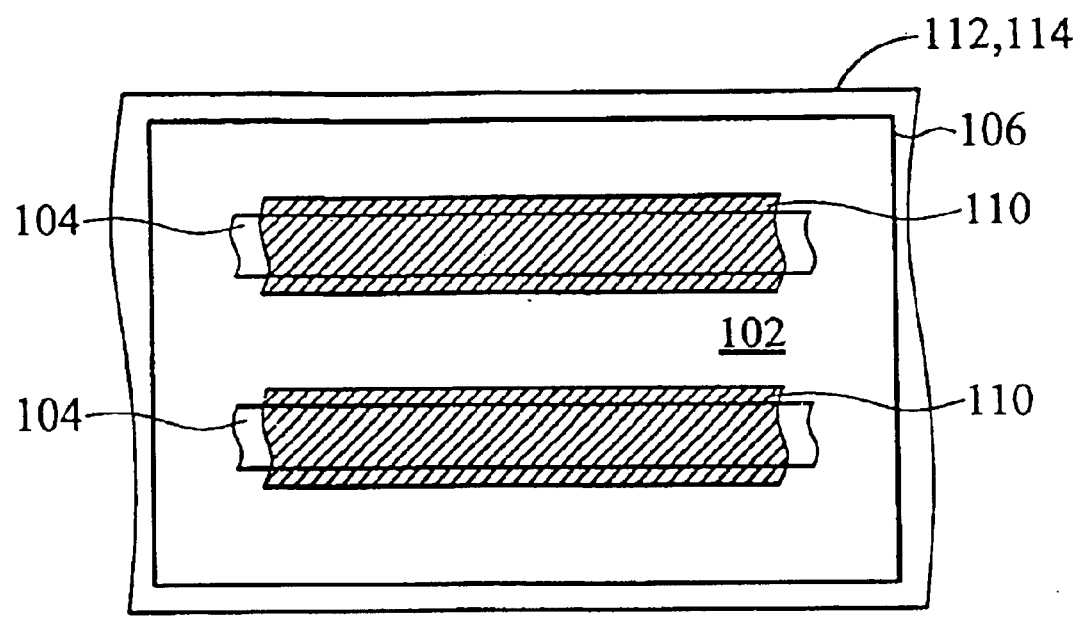
Figure 3B:
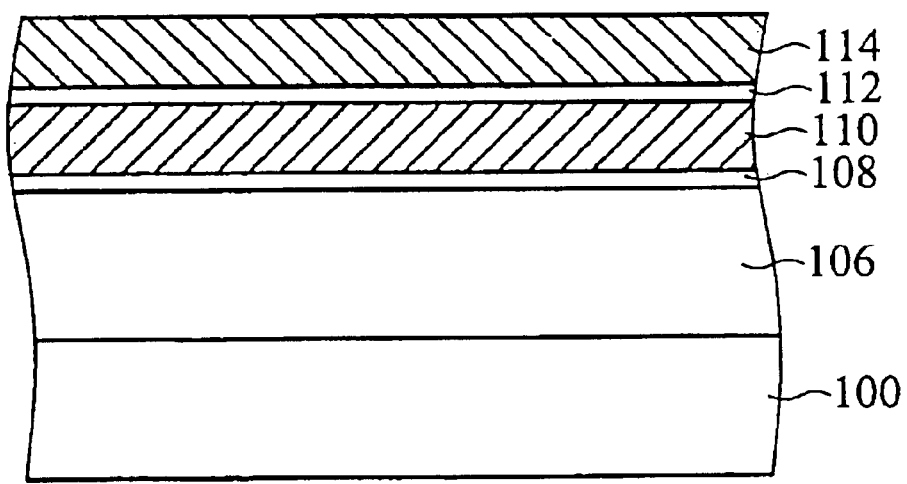
Figure 3C:
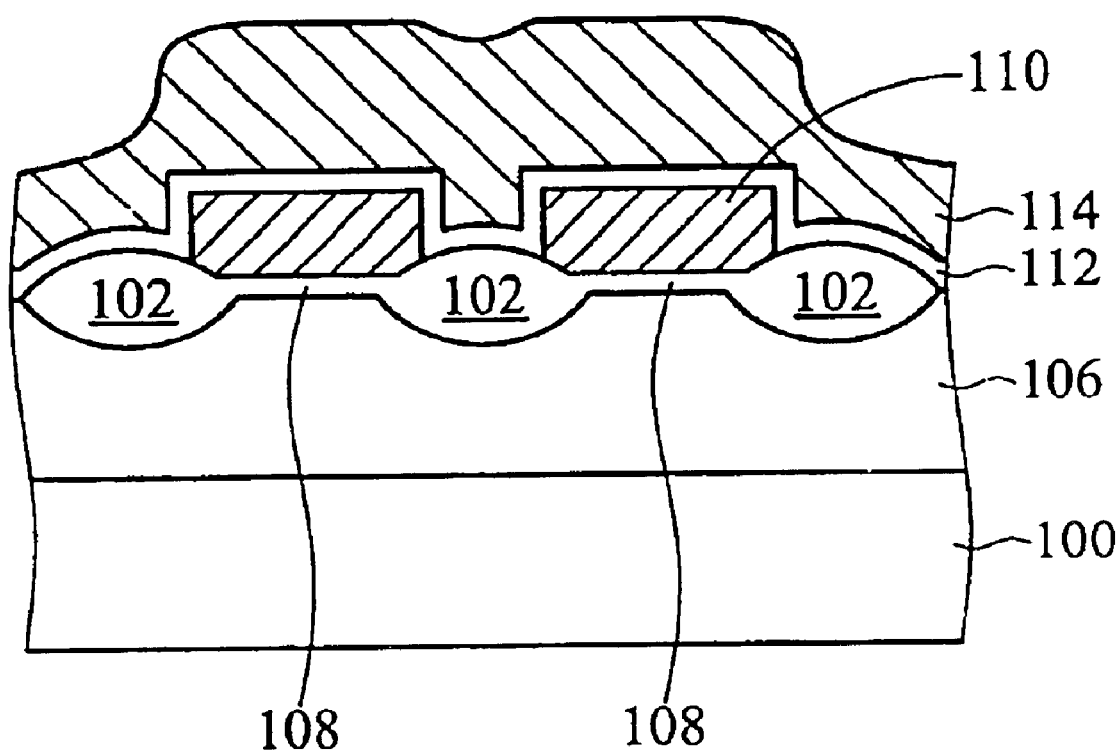

Please refer to FIG. 3A to FIG. 3C. The dielectric layer 112 is formed on the substrate 100 on which the first electrically conductive layer 110 is formed. The dielectric layer 112 is such as a silicon oxide/silicon nitride/silicon oxide (ONO) stacked structure of about 60 Å/about 70 Å/about 50 Å in thickness, wherein the silicon oxides can be high temperature oxide (HTO) formed by the high-temperature deposition process, and the silicon nitride can be formed by the low pressure chemical vapor deposition (LPCVD) method.

Thereafter, the second electrically conductive layer 114 is formed on the dielectric layer 112, and is a stacked electrical-conductive layer formed by the composition of a tungsten silicide layer and a doped polysilicon layer, wherein the forming method is, for example: sequentially depositing a doped polysilicon layer of about 1000 Å in thickness and a tungsten silicide layer of about 1250 Å in thickness.

Figure 4A:
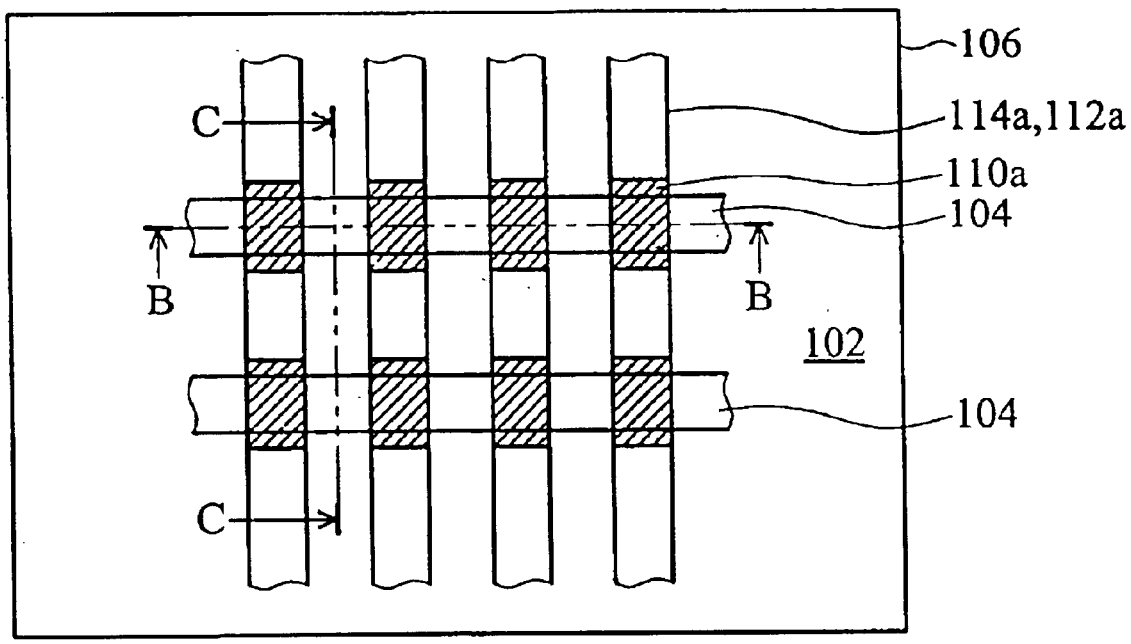
Figure 4B:
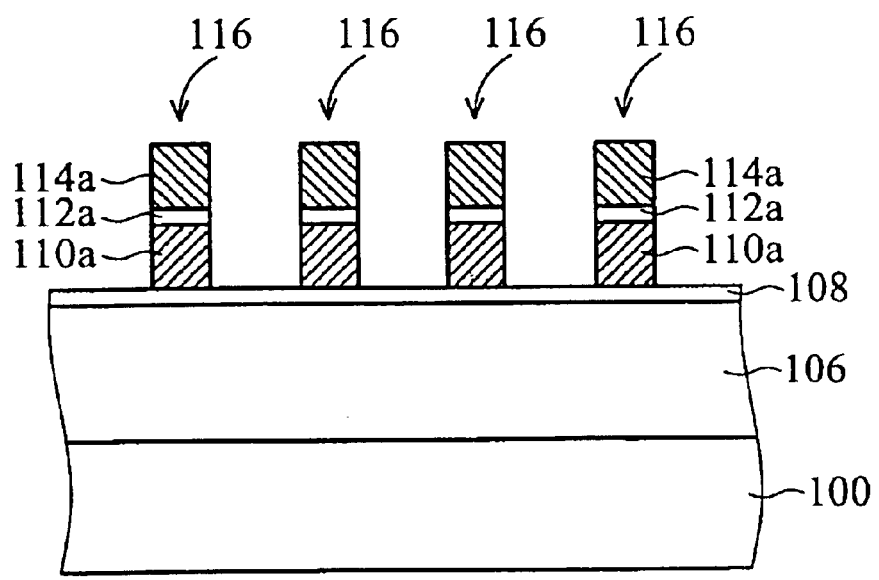
Figure 4C:
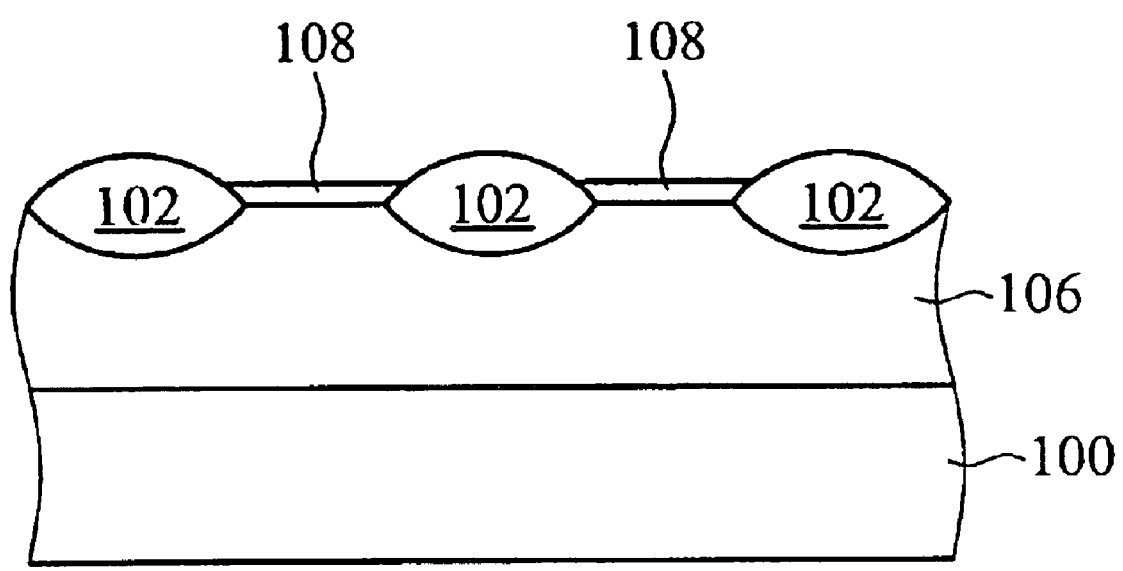

Please refer to FIG. 4A~FIG. 4C. A lithographic and etching process is performed as follows. A photoresist layer (not shown) having the pattern of wordline is formed. The second electrically conductive layer 114, the dielectric layer 112 and the striped first electrically conductive layer 110 are then etched by stopping on the tunneling oxide layer 108, so as to respectively convert the second electrically conductive layer 114, the dielectric layer 112 and the striped first electrically conductive layer 110 to stacked gate structures composed of the wordlines (also called a control gate) 114a, a dielectric layer 112a and floating gates 110a. The control gates 114a are striped and approximately perpendicular to the active areas 104.

Figure 5A:
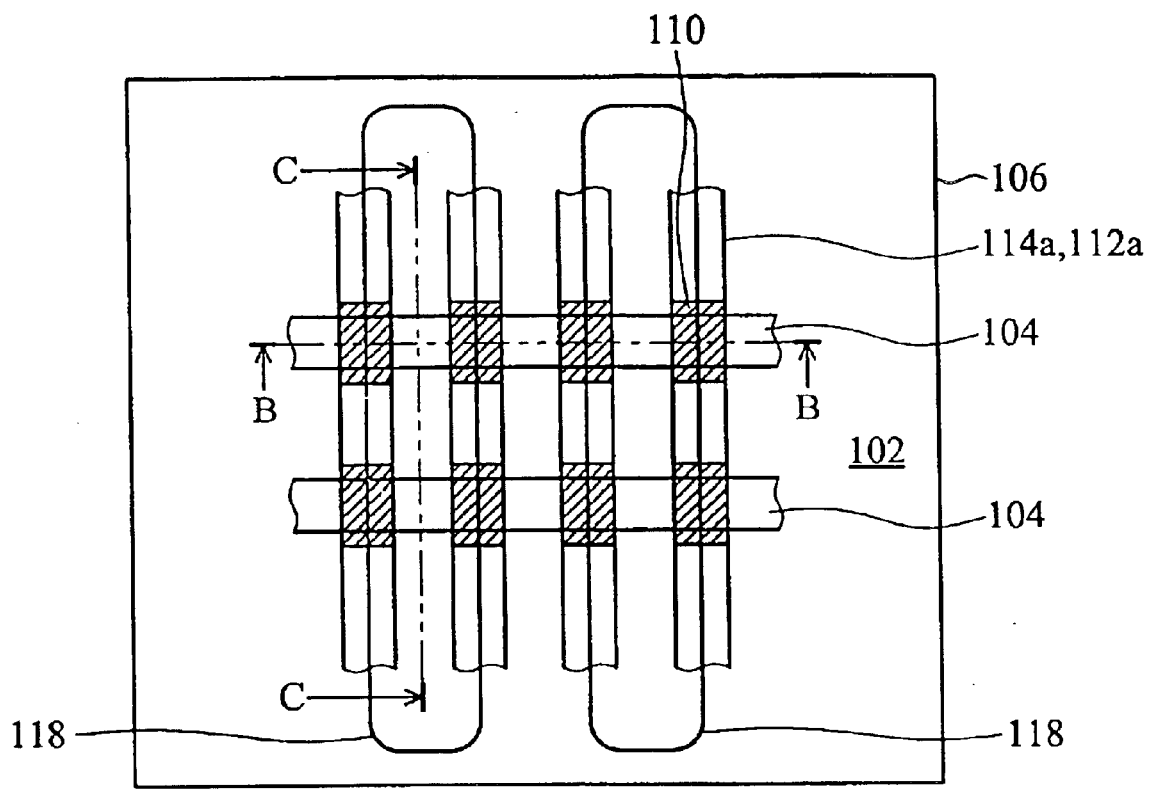
Figure 5B:
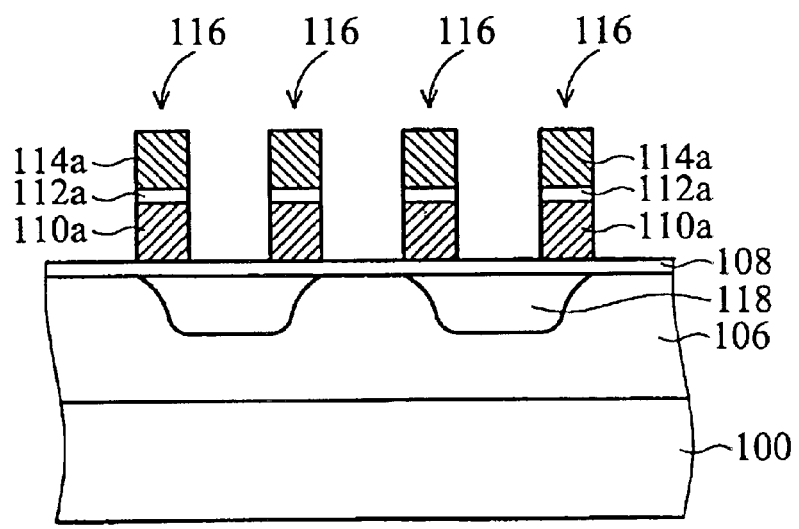
Figure 5C:
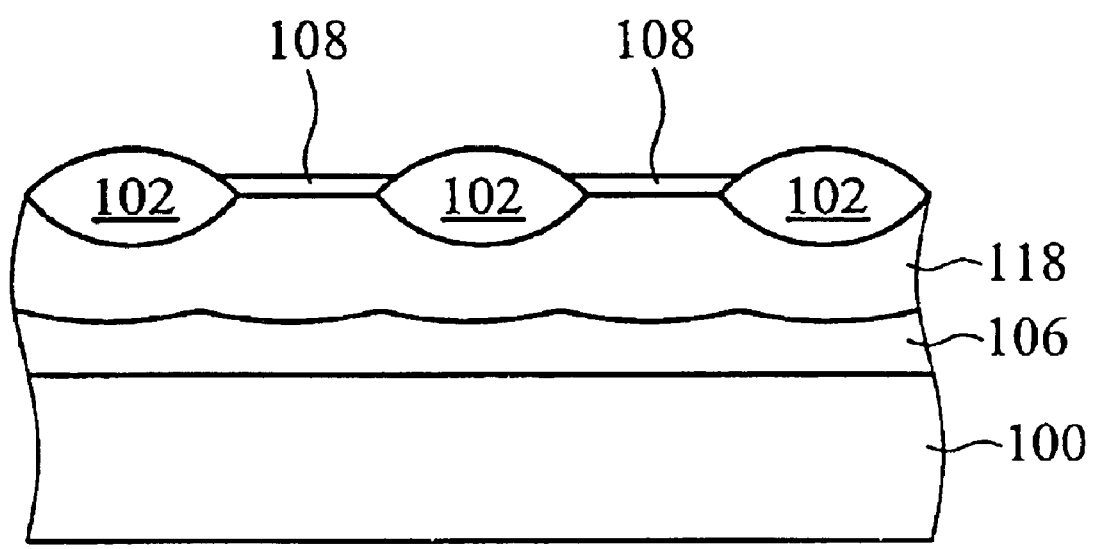

Please refer to FIG. 5A~FIG. 5C simultaneously. Each well of second conductive type 118, i.e. a p-well, is formed on the area corresponding to the drain between two adjacent control gates 114a, wherein the well of second conductive type 118 is disposed in the area below the device isolation regions 102 between two adjacent control gates 114a (such as shown in FIG. 5C) and enclosed by the deep well of first conductive type 106. The well of second conductive types 118 are striped and approximately perpendicular to the striped active areas 104. The striped wells of second conductive type 118 are electrically isolated.

The method to form the aforementioned well of second conductive type 118 is, for example: forming a photoresist layer (not shown) on the substrate 100; defining a pattern of the area corresponding to the drains between two adjacent control gates 114a (also including the device isolation region 102 in this area) on the photoresist layer; performing an ion implantation using the photoresist layer as a mask to implant p-type dopant; removing the photoresist layer; and, after the photoresist layer is removed, performing a heat treatment to merge the p-wells in the same direction of wordline into a stripe, wherein the ion implantation is to implant B11 of about $5 \times 10^{12} \sim 1 \times 10^{13}/cm^2$ at about 60 keV, and the heat treatment for activating the implanted p-dopant is performed for about 25~35 minutes, preferably 30 minutes, in an oxygen ($O_2$) environment of about 900° C., so as to grow an oxide layer of about 80 Å in thickness.

Please refer to FIG. 6A~FIG. 6C. The drains 122D and the sources 122S are sequentially formed on the active areas 104 located on both sides of the control gate 114a, wherein the drains 122D are enclosed by the wells of second conductive type 118, and the sources 122S are located on both sides of the wells of second conductive type 118, and are electrically connected via the deep well of first conductive type 106 so as to become a structure of common source line.

Since the sources 122S are electrically connected via the deep well of first conductive type 106 therebelow, unlike the conventional source line that needs to use an n+-doped active area with long and narrow shape to be electrically connected, the source lines of the present invention have lower resistance.

The method to form the aforementioned drains 122D is, for example: forming a photoresist layer (not shown) on the substrate 100 on which the control gates 114a are formed, wherein a pattern of the area corresponding to the drain is approximately defined on the photoresist layer; performing an ion implantation using the photoresist layer as a mask to implant n-type dopant; and removing the photoresist layer.

After the drains 122D are formed, spacers 120 are formed on both sides of the stacked gate structures 116, wherein the material of the spacers 120 can be silicon nitride, and their forming method is, for example: depositing a conformal silicon nitride layer of about 700 Å in thickness; and then performing an anisotropic etch.

The method to form the aforementioned drains 122S is, for example: forming a photoresist layer (not shown) on the substrate 100 on which the spacers 120 are formed, wherein a pattern of the area corresponding to the drains is defined on the photoresist layer; then performing an ion implantation using the photoresist layer as a mask to implant n-type dopant; and then removing the photoresist layer.

The aforementioned sources 122S and drains 122D are all n-doped regions, and formed by implanting arsenic (As) of about $1.5 \times 10^{15} \sim 2 \times 10^{15}/cm^2$ at about 50 keV.

Subsequently, an interlayer dielectric layer 124 is formed on the substrate 100 on which the sources 122S and the drains 122D are formed, and the contact plugs 126 connected to the drains 122D are formed in the interlayer dielectric layer 124. Then, the bitlines 128 are formed on the interlayer dielectric layer 124 on which the contact plugs 126 are formed.

Thereafter, the backend process is performed. However, the backend process is irrelevant to the present invention, and is not stated hereinafter.

Operating Method for Memory

Figure 7A:
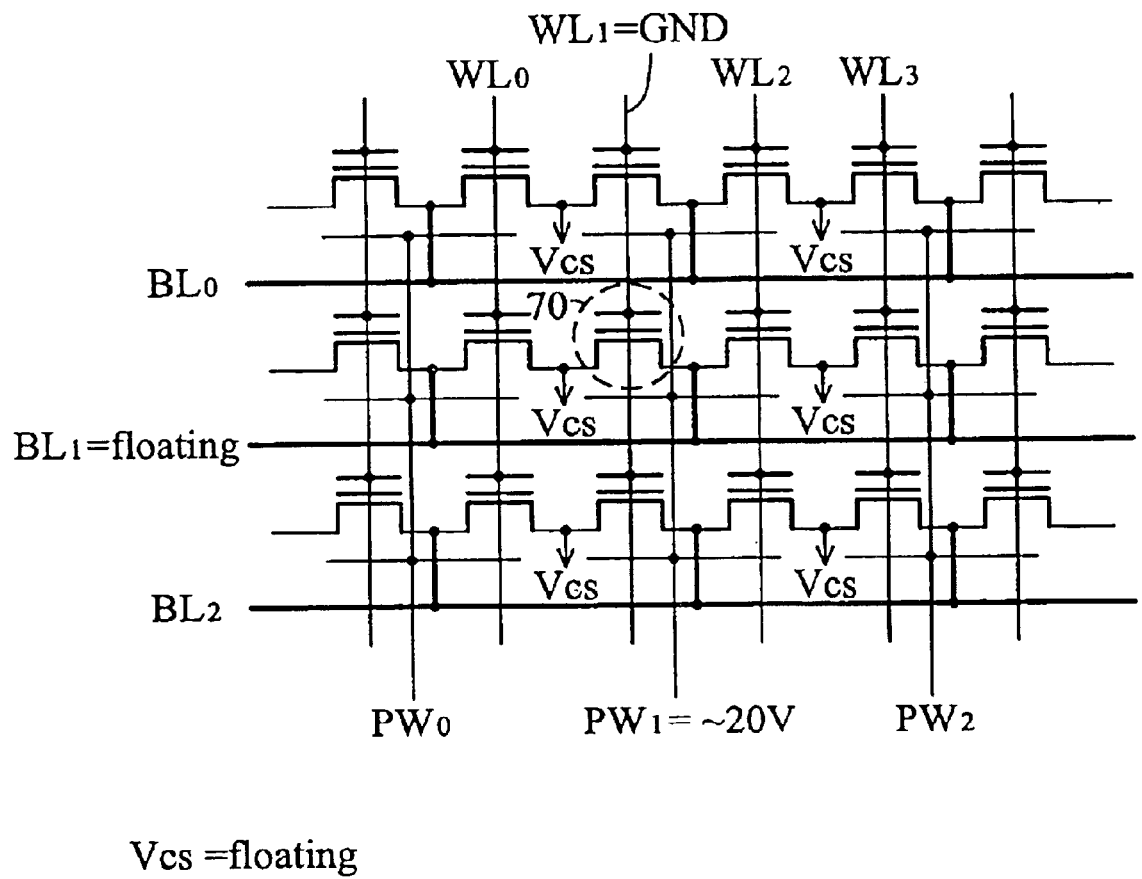
FIG. 7A is a diagram showing an erase operating method for the flash memory structure of the present invention.
Figure 7B:
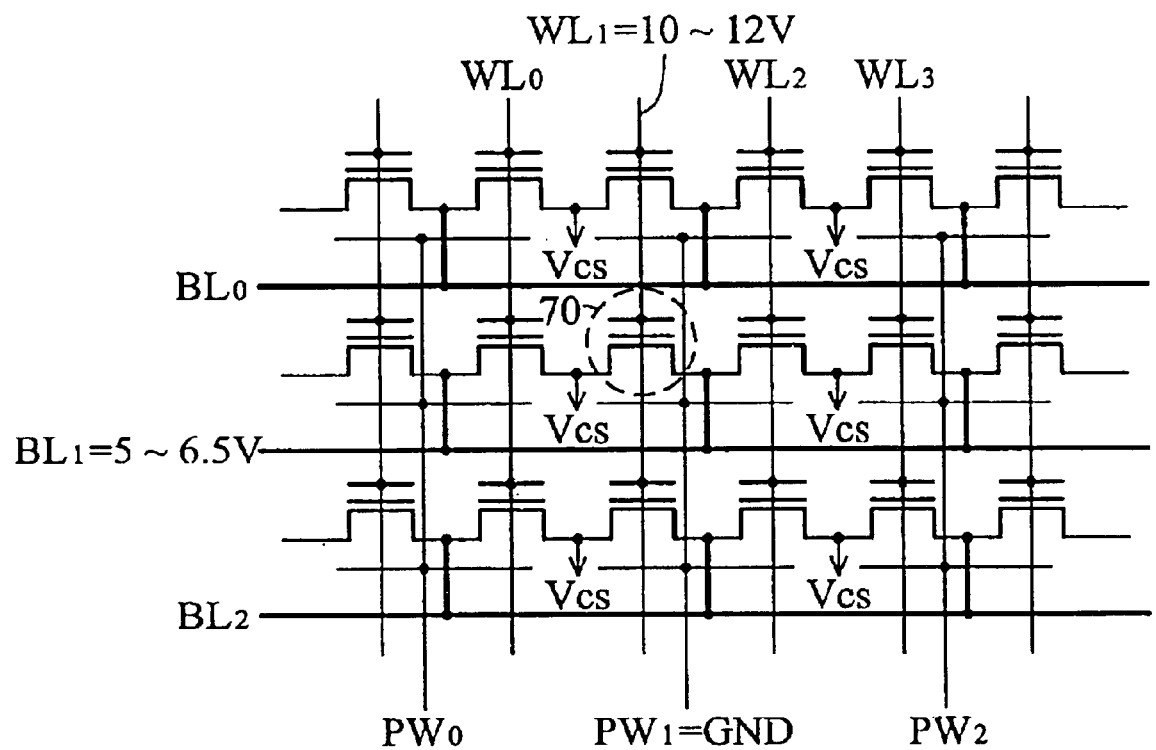
FIG. 7B is a diagram showing a programming operating method for the flash memory structure of the present invention.
Figure 7C:
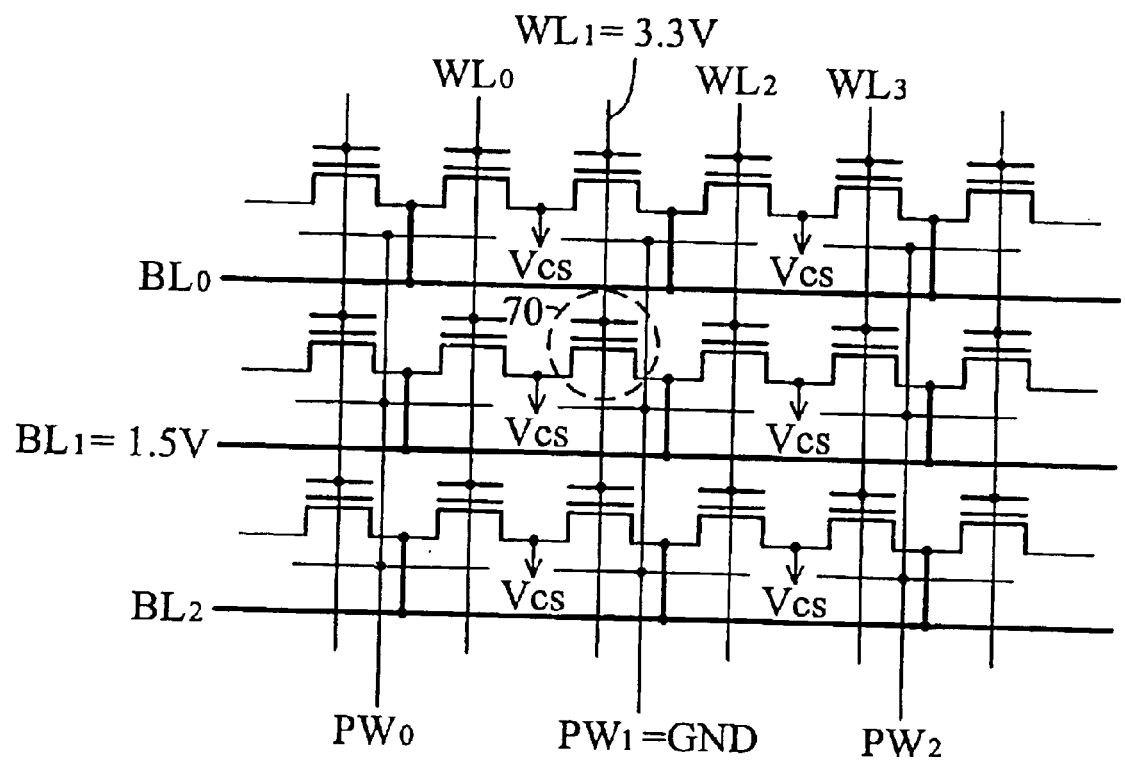
FIG. 7C is a diagram showing a read operating method for the flash memory structure of the present invention.

The following explanation for the operating method for the aforementioned flash memory structure is made in accordance with FIG. 7A to FIG. 7C, wherein FIG. 7A shows an erase operation; FIG. 7B shows a programming operation; and FIG. 7C shows a read operation.

In these figures, the wordline voltage, the source line voltage Vcs, the bitline voltage and the p-well voltage are respectively applied to the wordlines WL0~3, the sources and deep n-well, the drains, and the p-wells PW0~2, wherein each drain D is commonly used by two adjacent flash memory cells, and the sources are common sources connecting via the deep n-well.

FIG. 7A shows the voltage condition required to erase the data of the selected flash memory cell 70, and the detailed voltages for the erase operation are listed in table I. A positive voltage higher than the wordline voltage is applied to the p-well PW1, for example PW1=~20V, and the source line and all the bitelines are maintained in a floating state, i.e. Vcs=BL0=BL1=BL2=floating state, and the rest of the voltages are maintained in a ground state. Under the present situation, the electrons trapped in the floating gate of the flash memory cell 70 eject to the p-well via an FN tunnel, so as to achieve the erase operation by means of the channel erase scheme, wherein the erase operation is a page erase or block erase.

FIG. 7B shows the voltage condition required for programming the data into the flash memory cell 70, and the detailed voltages for the erase operation are listed in table I. A higher voltage is applied to the selected wordline WL1, for example WL1=10~12V, and a voltage lower than the wordline voltage is applied to the bitline BL1, for example BL1=5~6.5V, and the rest of the voltages are maintained at the ground state. Under the present situation, the hot carriers are injected to the floating gate of the flash memory cell 70 from the drain D via the channel, so as to achieve the programming operation.

FIG. 7C shows the voltage condition required for programming the data into the flash memory cell 70, and the detailed voltages for the erase operation are listed in table I. A proper voltage is applied to the selected wordline WL1, for example WL1=3.3V, and a voltage lower than the wordline voltage is applied to the bitline BL1, for example BL1=1.5V, and the rest of the voltages are maintained in the ground state. Under the present situation, the data in the flash memory cell 70 can be read out, wherein no current signal detected stands for the flash memory cell 70 at a programmed state and defining as 0; and some current signal detected stands for the flash memory cell 70 at an erased state and defining as 1.

TABLE I

Voltage Conditions of Erase, Programming and Read Operation

|  | Erase Operation | Programming Operation | Read Operation |
| --- | --- | --- | --- |
| Selected Wordline | GND | 10–12 V | 3.3 V |
| Unselected Wordline | GND | GN | GND |
| Selected Bitline | Floating | 5–5.6 V | 1.5 V |
| Unselected Bitline | Floating | Floating | Floating |
| Selected PW | –20 V | GND | GND |
| unselected PW | GND | GND | GND |
| Common Source (DNW) | Floating | GND | GND |

To summarize from the description above, the conventional flash memory using the source-terminal erase scheme, adopted by INTEL Corp. and AMD Inc., usually has inconsistent erase characteristics, which lowers the device reliability. In contrast, the present invention is a NOR flash memory adopting the channel erase scheme, thereby avoiding the problems of inconsistent erase characteristics and low device reliability.

In comparison with the circuit design of the conventional flash memory presented by AMD Inc., AMD's design is more complicated since it needs to utilize negative voltage to perform the erase operation, whereas the circuit design of the present invention is simpler since all the voltage operations in the present invention are positive.

Since the flash memory of the present invention utilizes the channel erase scheme to perform the erase operation, band tunneling conduction will not occur, and the distribution of erasing threshold voltage is more uniform, so that endurance is better.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An operating method to erase, programming and reading data on a flash memory, wherein a wordline voltage, a bitline voltage and a p-type doped well voltage are respectively applied to a control gate, a drain and a p-type doped well, all of which correspond to a selected flash memory cell; a source of the flash memory is a common source, and electrically connected via a deep n-type doped well; the drain is commonly used by the selected flash memory cell and an adjacent flash memory cell; and the p-type doped well is located between adjacent control gates corresponding to the drain, the operating method comprising:

applying a high voltage to the p-type doped well, while maintaining the wordline in a ground state, and the bitline and the common source in a floating state, thereby performing an erase operation;

applying a high voltage on the wordline while applying a voltage lower than the wordline voltage to the bitline voltage, and maintaining the voltage of the common source and the p-type doped well voltage in the ground state, thereby performing a programming operation; and applying a proper voltage to the wordline while applying a voltage lower than the wordline voltage to the bitline, thereby performing a read operation.

2. The operating method of claim 1 for erasing, programming and reading data on the flash memory, wherein the p-type doped well voltage is about 20V when the ease operation is performed.

3. The operating method of claim 1 for erasing, programming and reading data on the flash memory, wherein when the programming operation is performed, the wordline voltage is between 10V and 12V, and the bitline voltage is between 5V and 6.5V.

4. The operating method of claim 1 to erase, programming and reading data on the flash memory, wherein when the read operation is performed, the wordline voltage is about 3.3V, and the bitline voltage is about 1.5V.

* * * * *